United States Patent [19]

Adolfsson et al.

[11] Patent Number: 4,514,860
[45] Date of Patent: Apr. 30, 1985

[54] FIBER OPTICAL MEASURING DEVICE FOR MEASURING ELECTRICAL AND MAGNETIC QUANTITIES BY LATERALLY CONTROLLED PHOTO-LUMINESCENCE

[75] Inventors: Morgan Adolfsson; Torgny Brogardh; Bertil Hök; Christer Ovrén, all of Västerås, Sweden

[73] Assignee: ASEA Aktiebolag, Västerås, Sweden

[21] Appl. No.: 499,487

[22] Filed: May 31, 1983

[30] Foreign Application Priority Data

Jun. 2, 1982 [SE] Sweden ............... 8203391

[51] Int. Cl.³ ............................................. G01D 5/26
[52] U.S. Cl. ............................ 455/612; 250/227; 250/231 R; 370/1; 324/77 K
[58] Field of Search .............. 324/77 K, 95, 96; 370/3, 4; 250/231 R, 227; 455/612

[56] References Cited

U.S. PATENT DOCUMENTS 4,378,496  3/1983  Brogårdh et al. ............ 250/227
4,417,140 11/1983  Adolfsson et al. ............ 250/231 R

FOREIGN PATENT DOCUMENTS 2090654  7/1982  United Kingdom ............ 250/227

*Primary Examiner*—Joseph A. Orsino, Jr.
*Assistant Examiner*—Timothy K. Greer
*Attorney, Agent, or Firm*—Watson, Cole, Grindle & Watson

[57] ABSTRACT

A fiber optical measuring device for measuring primarily electric voltage or magnetic field, comprises a transducer having a sensor element, the transducer being connected by means of at least one optical fiber to a measuring electronic unit provided with at least two light sources having different emission spectra for excitation of photo-luminescence in the sensor element and at least one photo-detector for detection of photoluminescene emanating from the sensor element. The sensor element includes at least one luminescent layer arranged so that light from said optical fiber is arranged to fall towards the surface of the layer. Between the end surface of the optical fiber in the transducer and the surface of the luminescent layer, there is arranged at least one optical filter perpendicular to the ray path of the light. The luminescent layer is provided with at least two electrodes to generate, in the layer, a lateral electric field for the purpose of accelerating charge carriers which are excited by light emitted from the measuring electronic unit and transmitted to the luminescent layer via the optical fiber and through at least one of the filters.

18 Claims, 10 Drawing Figures

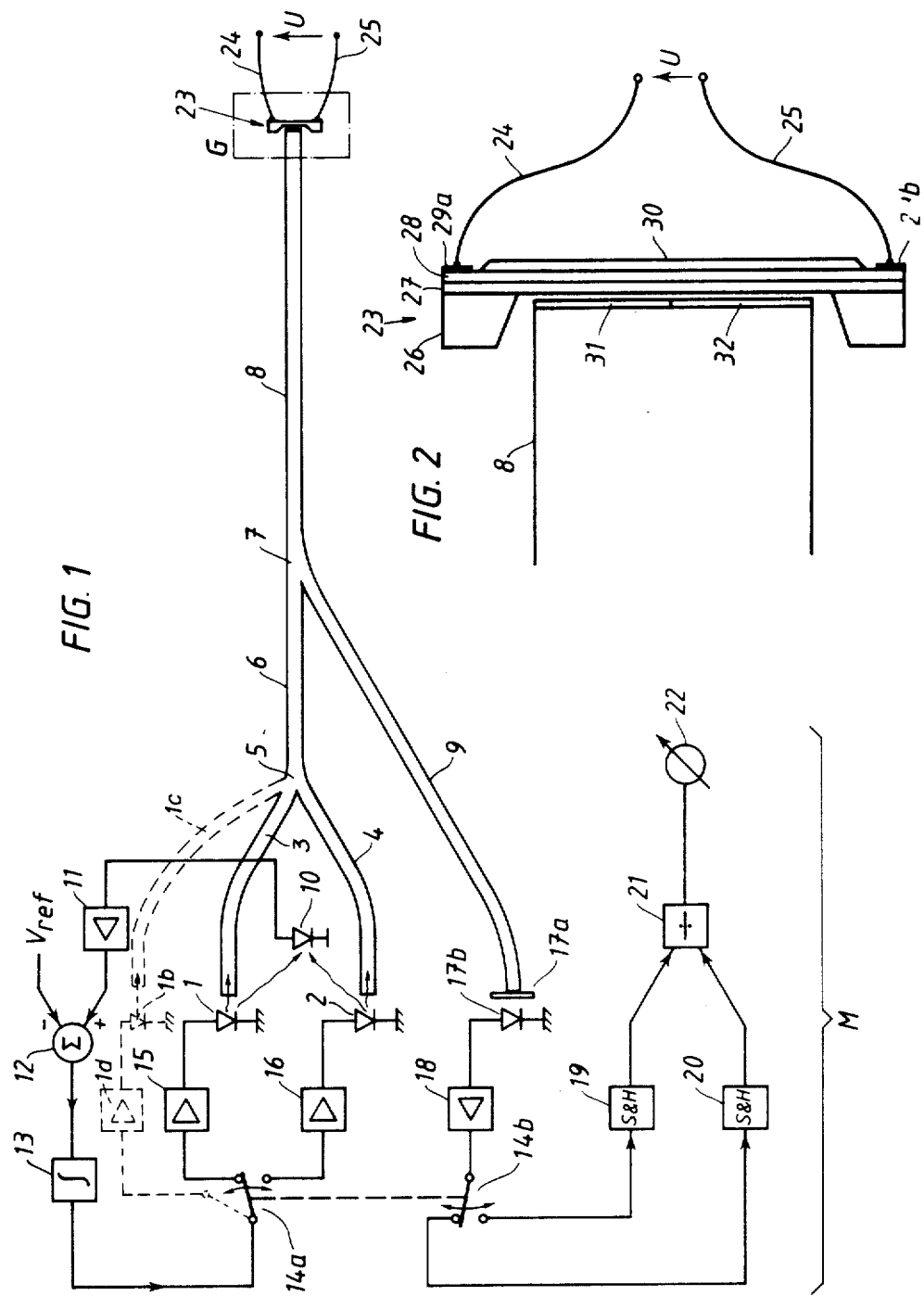

FIBER OPTICAL MEASURING DEVICE FOR MEASURING ELECTRICAL AND MAGNETIC QUANTITIES BY LATERALLY CONTROLLED PHOTO-LUMINESCENCE

BACKGROUND OF THE INVENTION

1. Field of the Invention

This invention relates to a fiber optical measuring device and has particular utility in the measuring of electrical and magnetic quantities such as voltage or magnetic field. The measuring device comprises a measuring electronic unit, a transducer having a sensor element, and at least one optical fiber means connecting the transducer to the measuring electronic unit. The measuring electronic unit includes at least two light source means having separate emission spectra for excitation of photoluminescence in the sensor element and at least one photo-detector means for detecting photoluminescence emanating from the sensor element.

Throughout this specification the term "light" is used to denote electromagnetic radiation in the vicinity of the visible spectrum, but it should be understood that the term includes electromagnetic radiation in the infrared and ultraviolet regions.

2. Description of Prior Art

In a power system there is a great need to measure electrical currents and voltages by means of optical fibers in a simple, inexpensive and reliable manner. Systems for measuring such quantities are already known and tested—see, for example, U.S. Pat. No. 4,290,146 and U.S. patent application Ser. No. 83,273, filed Oct. 10, 1979 (now abandoned). However, with today's technology such known systems have been found to have electronic or mechanical sensing systems which, to be reliable, are complex and thus expensive. It is desirable in this connection to be able to provide a simple and reliable sensor which, when placed at the end of an optical fiber, is able to sense an electric voltage, an electric current or a magnetic field and which, with great accuracy and speed, is able to convert these quantities into an optical signal.

One possibility for a system to achieve this aim is to measure a current by means of a light-emitting diode (LED), whereby the temperature-dependence of the LED can be compensated for by a simultaneous measurement of the spectral distribution of the emission spectrum—see U.S. Pat. No. 4,378,496. However, with such a known measuring system, the aging phenomena in the LED must be controlled which, at the present time, is difficult to combine with the requirement to provide an inexpensive measuring system. The main problems as regards the aging of LEDs are to be found in the crystal faults, caused by the injection current, in the light-emitted region and in an increasing number of non-radiant recombinations at the PN junction by the diffusion therein of deep recombination centers, as, for example, $Cu^+$.

SUMMARY OF THE INVENTION

The present invention proposes a measuring device which does not suffer from the above-identified problems. In particular, the invention aims to replace the injection process at a PN junction by optical excitation of charge carriers in a lateral luminescence layer, to displace the excited charge carriers with an electric and possibly a magnetic field, and to optically sense this displacement by a special method.

A measuring device according to the invention is characterized in that the sensor element includes at least one luminescent layer, that light from the optical fiber means is arranged to fall towards the surface of the layer, and between the end surface of the optical fiber means in the transducer and the surface of the luminescent layer there is arranged at least one optical filter means, perpendicular to the ray path of the light, and that the layer is provided with at least two electrodes to generate in the layer a lateral electric field for the purpose of accelerating charge carriers, excited by light from the measuring electronic unit and transmitted to the layer via the fiber means and through at least one of the optical filter means.

With this completely new technique for optical sensing of electrically or magnetically controlled charge carriers in a luminescent layer, simple and stable transducers for measuring voltage and current are obtained, which together with a simple fiber optical measuring system provide a possibility of measuring current and voltage without the effect of reflections and varying damping in the fiber system and without the dependence on the temperature and aging of the transducer.

BRIEF DESCRIPTION OF THE DRAWINGS

Embodiments of the invention will now be described in greater detail, and by way of example, with reference to the accompanying drawings, in which:

FIG. 1 shows a complete fiber optical measuring device according to the invention;

FIG. 2 shows a schematic side view of a sensor element of the device shown in FIG. 1 for measuring a DC voltage;

DESCRIPTION OF THE PREFERRED EMBODIMENTS

Figure 4:
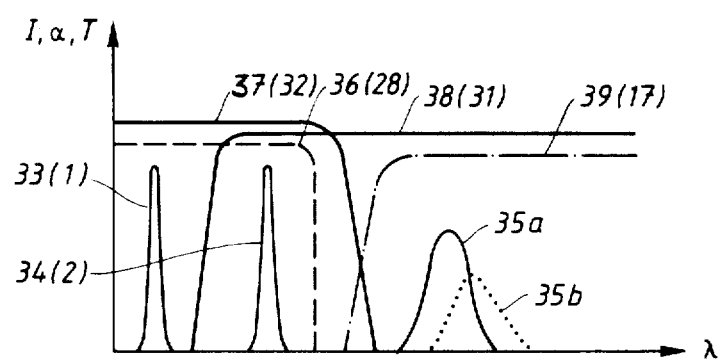
FIG. 4 shows the spectral relationships which exist in the measuring device shown in FIG. 1 when a sensor according to FIGS. 2 and 3 is used.

FIG. 1 shows a measuring system incorporating a measuring device according to the invention. The measuring device includes a sensor element 23 which is excited alternately by two light sources (LEDs) 1 and 2 having separate emission spectra 33 and 34 (see FIG. 4). The photo-luminescence (35 in FIG. 4) from the sensor element 23 is detected by a photo-diode 17b provided with a filter 17a, and the detector signal amplified by an amplifier 18 is supplied via a switch 14b, operating synchronously with a switch 14a, alternately to sample and hold (S and H) circuits 19 and 20, the quotient of the output signals thereof being formed in a quotient generator 21 and being supplied to an indicating element 22. For control of the light intensities from the light sources 1 and 2, light emitted therefrom is measured by a photodetector 10, which, via an amplifier 11, is coupled to a control circuit consisting of an error signal generator 12 and a regulator 13, the output signal of which is coupled by the switch 14a alternately between drive circuits 15 and 16. For conducting light between the opto-components (1, 2, 17 and 23) included in the system there are used optical fibers (3, 4, 6, 8, 9) and optical branches (5 and 7).

Figure 3:
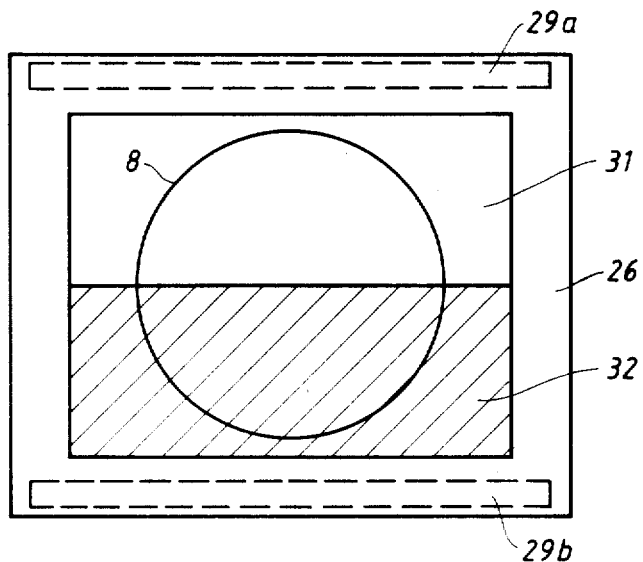
FIG. 3 shows a front view of the sensor element shown in FIG. 2.

The measuring principle can be explained with reference to FIGS. 1 to 4, of which FIG. 2 shows the sensor element 23 seen from the side and FIG. 3 shows the sensor element 23 seen from the front. The sensor element (see FIGS. 2 and 3) consists of the following different parts:

8: Optical fiber, which couples light to and from the sensor element 23.

31: An interference or absorption filter with a transmission spectrum 38 (according to FIG. 4).

32: An interference filter with a transmission spectrum 37.

26: A substrate of GaAs.

27: An epitaxial layer in $Al_{x_1}Ga_{a-s_1}$, the purpose of which is to entray optically excited charge carriers in layer 28 and admit both excitation spectra 33 and 34.

28: An epitaxial layer in $Al_{x_2}Ga_{1-x_2}As$, where $x_2 < x_1$, with high luminescence efficiency. The layer 28 has an absorption spectrum 36. Luminescence spectra 35a and 35b are shown, the spectra being those produced at different temperatures, spectrum 35a being at a lower temperature than spectrum 35b.

29a,b: Electrical (preferably ohmic) contacts to layer 28.

30: An epitaxial layer in $Al_{x_3}Ga_{1-x_3}As$, where $x_3 > x_2$, with the purpose of entrapping optically excited charge carriers in layer 28.

24, 25: Leads for connection of a measuring voltage U.

When the LED 1 (emission spectrum 33) is connected into the system, only that part of the layer 28 which is covered by the filter 32, having T-spectrum (transmission spectrum) 37, will be excited, since the filter 31 (T-spectrum 38) blocks this light. When the LED 2 (emission spectrum 34) is connected into the system, the whole layer 28 in front of the end surface of the fiber 8 will be illuminated. At the same time the filter 32 has such a T-spectrum 37 that this blocks the luminescence light 35 from the layer 28, and therefore normally no photo-luminescence signal is received by the photodetector 17b when the LED 1 is connected. Now, if a voltage U is applied according to FIG. 2, and if layer 28 is of p-type, some of the electrons excited by the LED 1 in the layer 28 covered by the filter 32 will be attracted by the lateral electrical field—generated by U—in the layer 28 into that region of the layer 28 which is covered by the filter 31 (with the T-spectrum 38), whereby a luminescence signal, dependent on the magnitude of U, is obtained at the detector 17b. When under the same circumstances the LED 2 is switched in, the whole layer 28 will be illuminated and the luminescence from that part of the layer 28 which is covered by the filter 31 will be independent of the voltage U. By forming the quotient, in the quotient generator 21, between the luminescence signals excited by the LEDs 1 and 2, a signal is obtained, according to this method, which is dependent on the voltage U and is compensated for varying damping in the fiber system, varying temperature of the transducer and aging of the sensor element 23. To eliminate the effect of reflections of the excitation light in the fiber system, the excitation light before the detector 17b is arranged to be blocked by an optical filter 17a having the T-characteristic 39 (see FIG. 4).

Figure 5:
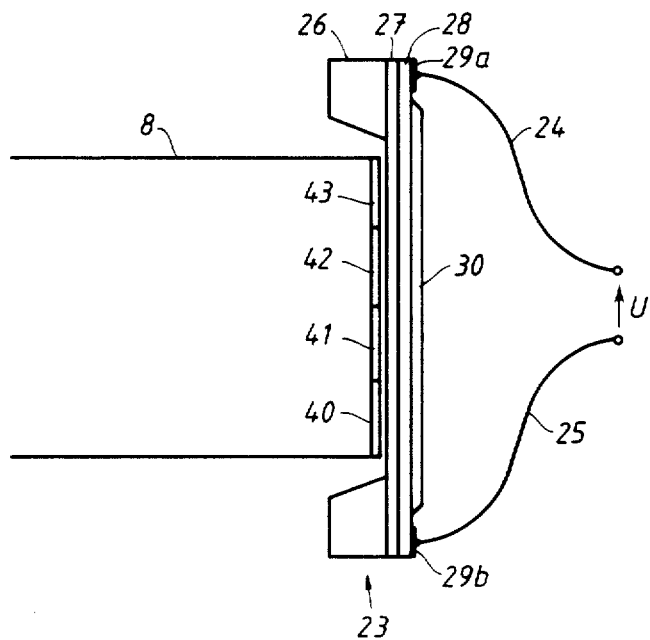
FIG. 5 shows a schematic side view of a sensor element for the measuring device shown in FIG. 1 for measuring AC voltages.
Figure 6:
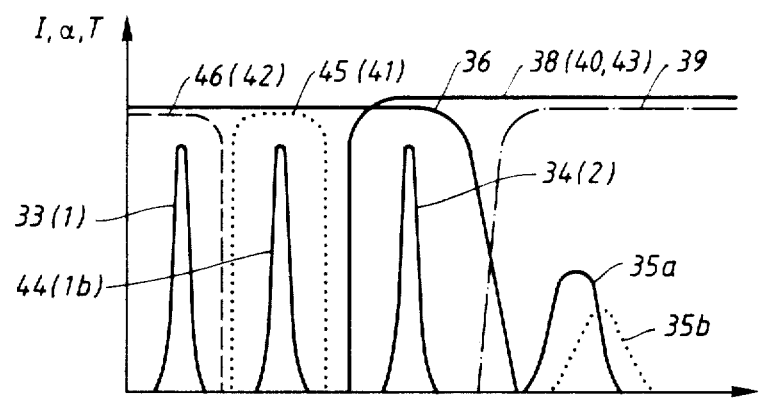
FIG. 6 shows the spectral relationships which exist in the measuring device shown in FIG. 1 when the sensor element according to FIG. 5 is used.

With the transducer according to FIG. 2, only a direct voltage U can be measured. To measure alternating voltages, a transducer according to FIG. 5 with the spectral relationships according to FIG. 6 can be utilized. The sensor element proper is identical with that shown in FIG. 2, but in order to be able to measure luminescence from recombined minority carriers, which by the AC field in the layer 28 have been displaced either upwards or downwards in the figure, a more complex filter arrangement (filters 40, 41, 42 and 43) is provided in the transducer and an additional light source 1b with an emission spectrum 44 is provided in the measuring electronic unit proper (see FIG. 1 where light source 1b is shown in phantom, together with its associated drive circuit 1d and the optical fiber 1c into which its light is directed). When the LED 1 is switched in and the emission spectrum 33 is obtained, the layer 28 will be excited only behind the filter 42, which has the T-spectrum 46. If the voltage U attracts the minority charge carriers upwards according to FIG. 5, luminescence will be generated behind the filter 43 (T-spectrum 38) and be transmitted to the detector 17 through the filter 43. When the light source 1b is switched in (emission spectrum 44), the layer 28 will only be excited behind the filter 41 (T-spectrum 45), and if the voltage U has reversed polarity and attracts the minority charge carriers downwards according to FIG. 5, luminescence will be generated behind the filter 40 (see curve 38) and be transmitted to the detector 17 through the filter 40. When, finally, the light source 2 (emission spectrum 34) is switched in, the layer 28 will be excited both behind filter 40 and filter 43 and a reference luminescence signal is obtained through the filters 40 and 43 (T-spectrum 38).

Figure 7:
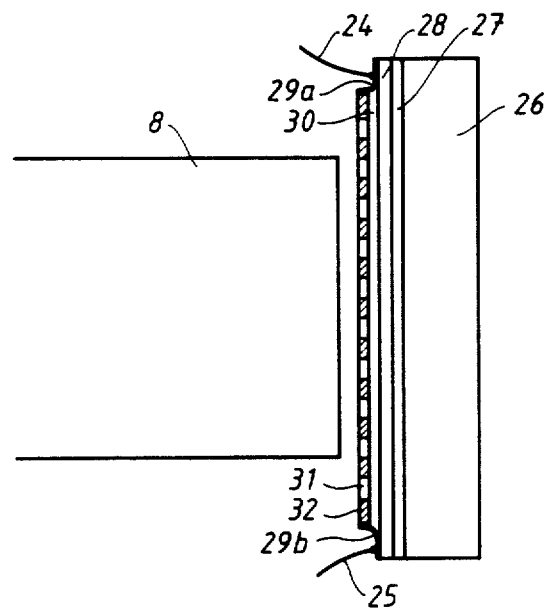
FIG. 7 shows a schematic side view of another sensor element for measuring small voltages.
Figure 8:
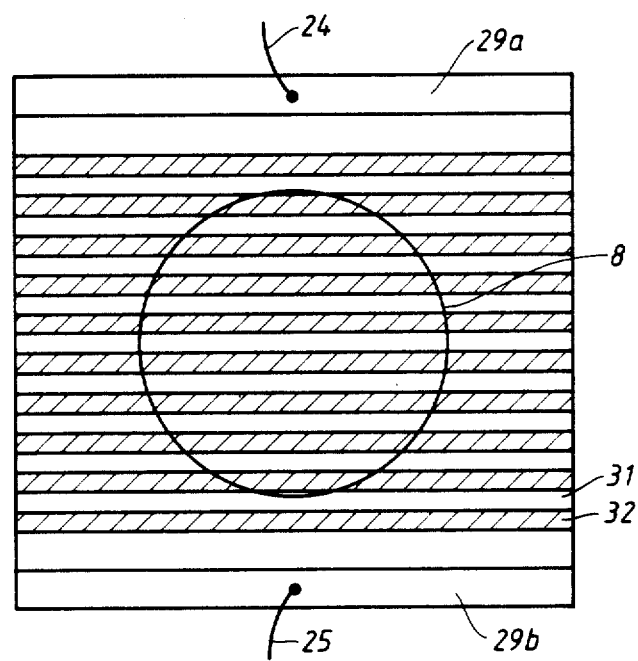
FIG. 8 shows the sensor element according to FIG. 7 seen from the front.

The lateral electric field in the layer 28, generated by the voltage U behind the electrodes 29a and 29b (see FIGS. 2 and 3), accelerates optically excited charge carriers and displaces the centre of gravity for the recombination process and thereby the luminescence. By growing an epitaxial layer 28 with high purity from impurity centers and dislocations, by entrapping the layer 28 between two layers 27 and 30 which are adapted to the lattice of the layer 28, and by using low doping levels in the layer 28, which shall be of the same type as the layers 27 and 30 (p- or n-type), relatively long lives of the excited minority charge carriers can be obtained and therefore also a good modulation at moderate voltages U. If small voltages are to be measured, however, it may be advantageous to use a screen pattern of optical filters (31, 32) according to FIGS. 7 and 8 to obtain a multiplicative effect and thus a greater signal/noise ratio. The filters 32 and 31 according to FIGS. 7 and 8 have the same characteristics as the filters 32 and 31 according to FIG. 2 (37 and 38, respectively, according to FIG. 4) but are, in FIG. 7, applied directly on the layer 30. With the sensor element design according to FIG. 7, the substrate 26 does not have to be etched out for the fiber 8. This provides for a more stable sensor, but at the same time it is necessary to ensure that no photo-luminescence is excited in the substrate. In addition to the filter screen pattern providing an increased signal/noise ratio, the effect on the measuring signal of mechanical displacements between the fiber and the sensor element will be reduced.

Figure 9:
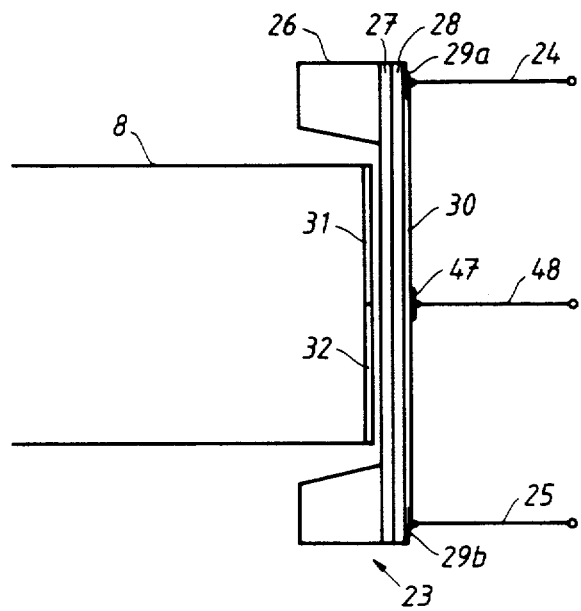
FIG. 9 shows a schematic side view of a further sensor element with a field effect electrode for high-ohmic voltage control.

The lateral electrical field in the luminescent layer 28 can be controlled, in addition to the voltage U, by one or more electrodes (47) which, in the same way as the function of a field effect transistor, bend the energy bands and thereby influence the lateral distribution of the charge carriers. Thus, FIG. 9 shows a sensor element which is identical to that of FIG. 2 except that the layer 30 is made thinner and in one region applied with the electrode 47, the voltage of which is controlled by way of the lead 48. With the aid of such a structure, resembling a field effect transistor, possibilities are provided for high-ohmic modulation of the luminescence and for introducing a reference voltage to the same element to which the measuring voltage is supplied.

Figure 10:
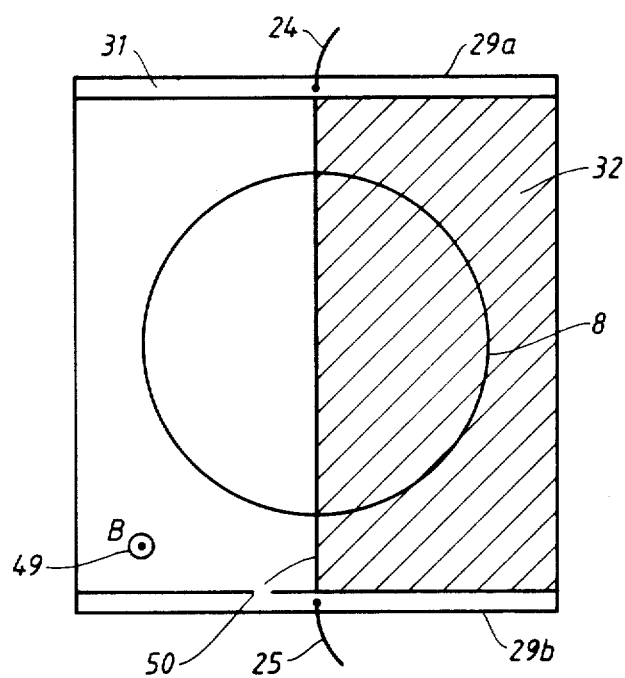
FIG. 10 shows a view from the front of another sensor element for measuring magnetic field.

Finally, FIG. 10 shows how a sensor element 23 with the previously described structure (see, e.g., FIGS. 2 and 3) can be employed for measuring a magnetic field (49) perpendicular to the sensor element surface. Contrary to the filter configurations (31, 32) in previous Figures, in this case the common edge lines (50) of the filters for measuring the magnetic field must be more or less parallel to the electric field lines produced by the electrodes 29a and 29b. The movement of the optically excited charge carriers, which is modulated by the lateral electric field in the layer 28, will be deflected by the magnetic field so that charge carriers excited under one of the filters (32) can be displaced to that part of the layer (28) which is located behind an adjacent filter (31) and there generate luminescence which can reach the photo-detector 17.

The structure according to FIG. 10 thus constitutes an optical Hall element. For fiber optical magnetic field measuring, series-connected photo-diodes can be used for generation of the electric field in the layer 28. Since this field becomes temperature dependent, this field is suitably measured simultaneously according to one of the methods described above for voltage measurement, whereby the sensor will be provided with optical filters, the common edge lines of which are both perpendicular and parallel to the electric field in the layer 28.

The invention according to the above can be varied in many different ways to obtain luminescence with the aid of a displacement, controlled by the quantities to be measured, of optically excited charge carriers in a region with a different filter characteristic from the region where the excitation occurs.

What is claimed is:

1. In a fiber optical measuring device which includes a transducer having a sensor element; a measuring electronic unit having two light-emitting means and a photodetector means, the first of said light-emitting means being capable of emitting a light ray having an emission spectra which is different from that of the second of said light-emitting means, and said photodetector means being capable of detecting photoluminescence emanating from said sensor element, and an optical fiber means which extends from said measuring electronic unit into said transducer so as to convey light rays from said two light-emitting means to said sensor element and to convey photoluminescence emitted from said sensor element to said photodetector means, the improvement wherein said sensor element includes a luminescent layer which has a front surface and a rear surface, said optical fiber means having an end within said transducer which is directed towards the front surface of said luminescent layer, an optical filter means is positioned between said end of said optical fiber means and the front surface of said luminescent layer, said optical filter means being oriented so as to be substantially perpendicular to the light rays passing out of said end of said optical fiber means, and having a plurality of zones of different light transmission characteristics, and two electrodes are connected to said luminescent layer so as to generate a lateral electric field within said luminescent layer and cause charge carriers which have been generated in one portion of said luminescent layer by the light rays passing through said optical filter means and onto the front surface of said luminescent layer to accelerate to another portion of said luminescent layer, the photoluminescence produced by said relocated charge carriers being received by said photodetector.

2. The fiber optical measuring device as defined in claim 1, wherein said optical filter means includes two zones having different light transmission characteristics.

3. The fiber optical measuring device as defined in claim 2, wherein a first of said two zones allows light emitted from said first light-emitting means to pass therethrough and to strike a corresponding area of said luminescent layer covered thereby, and at the same time prevents photoluminescence produced by the accelerated charge carriers in said corresponding area of said luminescent layer covered thereby to pass therethrough and thus prevents detection of said photoluminescence by said photodetector means.

4. The fiber optical measuring device as defined in claim 3, wherein a second of said two zones prevents light emitted from said first light-emitting means from passing therethrough and thus prevents it from striking a corresponding area of said luminescent layer covered thereby, and at the same time allows photoluminescence produced by the accelerated charge carriers which have traveled into the corresponding area covered thereby from the area of said luminescent layer covered by said first zone to pass therethrough and thus be detected by said photodetector means.

5. The fiber optical measuring device as defined in claim 4, wherein said second zone allows light emitted from said second light-emitting means to pass therethrough and to strike the corresponding area of said luminescent layer covered thereby, and at the same time allows photoluminescence produced by the accelerated charge carriers in the corresponding area of the luminescent layer covered thereby to pass therethrough and be detected by said photodetector means.

6. The fiber optical measuring device as defined in claim 5, wherein said optical filter means comprises two separate optical filter elements, said filter elements displaying said different light transmission characteristics.

7. The fiber optical measuring device as defined in claim 5, including means connected to said first and second light-emitting means to activate them to alternately emit light therefrom into said optical fiber means.

8. The fiber optical measuring device as defined in claim 7, wherein said means includes separate drive circuits respectively connected to said two light-emitting means.

9. The fiber optical measuring device as defined in claim 8, wherein said means includes a switch which alternately activates said drive circuits, and wherein a control circuit is connected to said switch to control its operation.

10. The fiber optical measuring device as defined in claim 5, including output means connected to said photodetector means to provide an output signal dependent on the photoluminescence detected by said photodetector means when said first light-emitting means is activated and when said second light-emitting means is activated.

11. The fiber optical measuring device as defined in claim 5, including a third electrode connected to said luminescent layer between said two electrodes, an electric voltage applied thereto acting to modulate the lateral electric field generated therein by said two electrodes.

12. The fiber optical measuring device as defined in claim 1, wherein said luminescent layer consists of a layer of $Al_xGa_{1-x}As$.

13. The fiber optical measuring device as defined in claim 12, wherein semiconductor layers are respectively located on the front and rear surfaces of said luminescent layer, said semiconductor layers having larger band gaps and a higher Al content than said luminescent layer.

14. The fiber optical measuring device as defined in claim 12, wherein the end of said optical fiber means in said transducer has a round cross section, and wherein said optical filter means has larger dimensions than said end of said optical fiber means.

15. The fiber optical measuring device as defined in claim 12, wherein said optical filter means comprises two separate optical filter elements having different light transmission characteristics, wherein said two filter elements abut one another along a common, straight line, and wherein said common, straight line extends in parallel to a line extending between said two electrodes, such that said fiber optical measuring device can measure the strength of a magnetic field whose lines extend perpendicularly to the front surface of said luminescent layer.

16. The fiber optical measuring device as defined in claim 1, wherein said optical filter means has at least three zones of different light transmission characteristics.

17. The fiber optical measuring device as defined in claim 16, including a third light-emitting means which has an emission spectra which is different from that of either of said first and second light-emitting means.

18. The fiber optical measuring device as defined in claim 1, wherein said optical filter means is in the form of a screen pattern of optical filter elements defining said zones of different light transmission characteristics.

* * * * *